(12) United States Patent
Abe

(10) Patent No.: US 7,705,321 B2
(45) Date of Patent: Apr. 27, 2010

(54) CHARGED PARTICLE BEAM WRITING APPARATUS AND METHOD

(75) Inventor: Takayuki Abe, Kanagawa (JP)

(73) Assignee: NuFlare Technology, Inc., Namazu-shi (JP)

( * ) Notice: Subject to any disclaimer, the term of this patent is extended or adjusted under 35 U.S.C. 154(b) by 145 days.

(21) Appl. No.: 12/129,048

(22) Filed: May 29, 2008

(65) Prior Publication Data

US 2008/0296515 A1    Dec. 4, 2008

(30) Foreign Application Priority Data

May 30, 2007   (JP) .............................. 2007-143034

(51) Int. Cl.
*H01J 37/21* (2006.01)
*G21K 1/00* (2006.01)
*G21K 5/04* (2006.01)
(52) U.S. Cl. .............. 250/396 R; 250/398; 250/492.22; 250/492.2; 250/492.3; 313/361.1
(58) Field of Classification Search ............. 250/396 R, 250/398, 492.22, 492.2, 492.3; 313/361.1
See application file for complete search history.

(56) References Cited

U.S. PATENT DOCUMENTS

| | | | | | |
|---|---|---|---|---|---|
| 4,153,843 | A | * | 5/1979 | Pease ....................... | 250/492.2 |
| 4,694,178 | A | * | 9/1987 | Harte ...................... | 250/396 R |
| 2009/0057570 | A1 | * | 3/2009 | Abe ........................ | 250/492.2 |
| 2009/0057576 | A1 | * | 3/2009 | Abe et al. ............... | 250/492.23 |
| 2009/0200488 | A1 | * | 8/2009 | Yashima et al. .......... | 250/492.2 |

FOREIGN PATENT DOCUMENTS

| | | |
|---|---|---|
| JP | 6-177021 | 6/1994 |
| JP | 8-274008 | 10/1996 |
| JP | 3277746 | 4/2002 |
| JP | 2002-150989 | 5/2002 |

OTHER PUBLICATIONS

T. Haraguchi, et al., "Multicolumn cell: Evaluation of the proof of concept system", J. Vac. Sci. Technol. vol. 22, No. 3, May/Jun. 2004, pp. 985-988.

T. Haraguchi, et al., "Development of electromagnetic lenses for multielectron beam lithography system", J. Vac. Sci. Technol., vol. 20, No. 6, Nov./Dec. 2002, pp. 2726-2729.

H. Yasuda, et al., "Evaluation of Multi-column-cell (MCC) PoC (Proof of Concept) System", $3^{rd}$ Symposium of Charged Particle Optics, Sep. 18-19, 2003, pp. 125-128 (with English Translation).

* cited by examiner

*Primary Examiner*—Nikita Wells
(74) *Attorney, Agent, or Firm*—Oblon, Spivak, McClelland, Maier & Neustadt, L.L.P.

(57) ABSTRACT

A charged particle beam writing apparatus includes a stage on which a target object is placed and which moves in a predetermined direction, a first column configured to irradiate a first charged particle beam on a writing region of the target object, a second column which is located at the back of the first column in the predetermined direction and configured to irradiate a second charged particle beam on the writing region of the target object, and a sensor configured to measure a height level of the target object at any one of a position in front of a position where the first column irradiates the first charged particle beam in the predetermined direction and a position almost immediately under the position where the first charged particle beam is irradiated.

10 Claims, 13 Drawing Sheets

CHARGED PARTICLE BEAM WRITING APPARATUS AND METHOD

CROSS-REFERENCE TO RELATED APPLICATION

This application is based upon and claims the benefit of priority from prior Japanese Patent Application No. 2007-143034 filed on May 30, 2007 in Japan, the entire contents of which are incorporated herein by reference.

BACKGROUND OF THE INVENTION

1. Field of the Invention

The present invention relates to a charged particle beam writing apparatus and a charged particle beam writing method, for example, a measuring procedure or a using method for a surface height level of a target object when a writing position is corrected at the surface height level and a writing apparatus which includes a multicolumn for measuring a surface height level of a target object.

2. Related Art

A lithography technique which bears the advance of micropatterning of a semiconductor device is only a very important process which generates a pattern in semiconductor manufacturing processes. In recent years, with a high degree of integration of an LSI, a circuit line width required for a semiconductor device is miniaturized every year. In order to form a desired circuit pattern to the semiconductor device, a high-precision original pattern (also called a reticle or a mask) is necessary. In this case, an electron beam writing technique inherently has an excellent resolution and is used in production of a high-precision original pattern.

FIG. 14 is a conceptual diagram for explaining an operation of a variable shaping electron beam writing apparatus.

The variable shaping electron beam (EB) writing apparatus operates as described below. In a first aperture 410, an oblong (for example, rectangular) opening 411 to shape an electron beam 330 is formed. In a second aperture 420, a variable shaping opening 421 to shape the electron beam 330 passing through the rectangular opening 411 into a desired oblong shape is formed. The electron beam 330 irradiated from a charged particle source 430 and passing through the rectangular opening 411 is deflected by a deflector. The electron beam 330 passes through a part of the variable shaping opening 421 and is irradiated on a target object placed on a stage. The stage continuously moves in a predetermined direction (for example, an X direction). In this manner, an oblong shape which can pass through both the opening 411 and the variable shaping opening 421 is written in a writing region of the target object 340. A scheme which causes an electron beam to pass through both the rectangular opening 411 and the variable shaping opening 421 to form an arbitrary shape is called a variable shaping scheme.

In this case, in the electron beam writing apparatus, a writing position changes depending on the height of a target object surface of a mask or a wafer. For this reason, a height (z) is required to be measured to correct the position depending on the measured value. For example, the height of the entire mask is measured in advance before the pattern writing, and pattern writing is performed while correcting the position depending on the value (for example, see Japanese Patent No. 3277746). Alternatively, height data is obtained while performing pattern writing, and the pattern writing is performed on real time by using the value while performing correction.

A writing apparatus using a multicolumn cell (MCC) scheme achieved by incorporating two or more optical system columns in one electron lens barrel is developed. The columns are arranged in the same writing condition, and each of the columns performs variable-shaped pattern writing (for example, see "Yasuda Hiroshi, Haraguchi Takeshi, et al., "multicolumn cell MCC-PoC (Proof of concept) system evaluation", 3rd symposium of charged particle optics, pp. 125 to 128, Sep. 18 to 19, 2003", "T. Haraguchi, T. Sakazaki, S. Hamaguchi and H. Yasuda, "Development of electromagnetic lenses for multielectron beam lithography system", 2726, J. Vac. Sci. Technol. B20 (6), November/December 2002", or "T. Haraguchi, T. Sakazaki, T. Satoh, M. Nakano, S. Hamaguchi, T. Kiuchi, H. Yabara and H. Yasuda, "Multicolumn cell: Evaluation of the proof of concept system", 985, J. Vac. Sci. Technol. B22 (3), May/June 2004").

As described above, there is a method of measuring a height in advance. However, when a height is measured in advance, the measurement time directly generates a loss time to make a writing time longer. When correction is performed on real time in a writing apparatus including a multicolumn, height measurers (z sensors) the number of which is equal to the number of columns are necessary. In this case, the manufacturing cost of the apparatus disadvantageously increases. Furthermore, in order to mount a large number of z sensors, it is difficult to reduce the z sensors in size.

BRIEF SUMMARY OF THE INVENTION

The present invention has as its object to provide a method of suppressing a pattern writing time from being increased by height measurement. Furthermore, the present invention has as its object to provide a method and apparatus of reducing the number of sensors when a multicolumn is used.

A charged particle beam writing apparatus according to one aspect of the present invention, includes a stage on which a target object is placed and which moves in a predetermined direction, a first column configured to irradiate a first charged particle beam on a writing region of the target object, a second column which is located at the back of the first column in the predetermined direction and configured to irradiate a second charged particle beam on the writing region of the target object, and a sensor configured to measure a height level of the target object at any one of a position in front of a position where the first column irradiates the first charged particle beam in the predetermined direction and a position almost immediately under the position where the first charged particle beam is irradiated.

A charged particle beam writing apparatus according to one aspect of the present invention, includes measuring a surface height level of an nth writing small region of a plurality of writing small regions formed by virtually dividing a writing region of a target object in the form of stripes while moving the target object in a predetermined direction; by using a charged particle beam irradiated through a first column located at a forward position in the predetermined direction, writing a first pattern, wherein a writing position of the first pattern is corrected on the basis of the surface height level of the nth writing small region in the nth writing small region on the target object which moves in the predetermined direction; and by using a charged particle beam irradiated through a second column located at a backward position in the predetermined direction, writing a second pattern, wherein a writing position of the second pattern is corrected by using information, used once, of the surface height level of the nth writing small region again in the nth writing small region on the target object which moves in the predetermined direction.

A charged particle beam writing method according to another aspect of the present invention, includes writing a pattern for the nth writing small region of a plurality of writing small regions formed by virtually dividing a writing region of a target object in the form of stripes while moving the target object in a predetermined direction; upon completion of the writing of the nth writing small region, measuring a surface height level of an (n+1)th writing small region while moving the target object in a direction opposing the predetermined direction; and upon completion of the measurement of the surface height level of the (n+1)th writing small region, in the (n+1)th writing small region, by using a charged particle beam irradiated through a column used in the writing in the nth writing small region, writing a pattern for the (n+1)th writing small region, wherein a writing position of the pattern for the (n+1)th writing small region is corrected on the basis of a measured surface height level of the (n+1)th writing small region, while moving the target object in the predetermined direction.

DETAILED DESCRIPTION OF THE INVENTION

In the following embodiments, as one example of a charged particle beam, a configuration using an electron beam will be described below. The charged particle beam is not limited to an electron beam. A beam such as an ion beam which use other charged particles may be used.

First Embodiment

Figure 1:
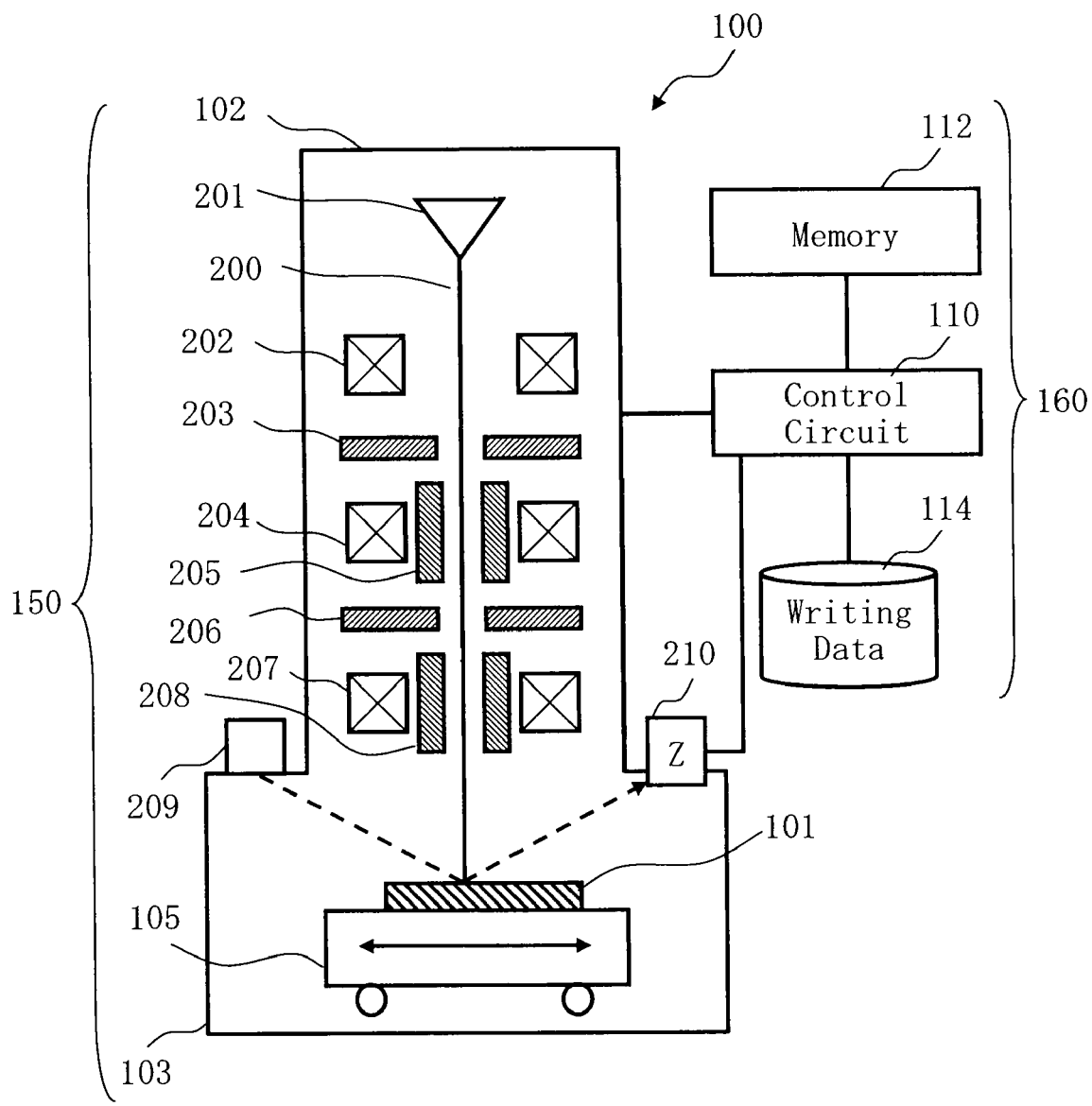
FIG. 1 is a conceptual diagram showing a configuration of a writing apparatus according to a first embodiment.

FIG. 1 is a conceptual diagram showing a configuration of a writing apparatus according to a first embodiment.

In FIG. 1, a writing apparatus 100 includes a pattern writing unit 150 and a control unit 160. The writing apparatus 100 serves as an example of a charged particle beam writing apparatus. The writing apparatus 100 writes a desired pattern on the target object 101. The control unit 160 includes a control circuit 110, a memory 112, and a magnetic disk device 114. The pattern writing unit 150 includes an electron lens barrel 102 and a writing chamber 103. In the electron lens barrel 102, an electron gun assembly 201, an illumination lens 202, a first aperture plate 203, a projection lens 204, a deflector 205, a second aperture plate 206, an objective lens 207, and a deflector 208 are arranged. In the writing chamber 103, an XY stage 105 which is movable is arranged. On the XY stage 105, the target object 101 is arranged. As the target object 101, for example, an exposure mask to transfer a pattern onto a wafer is included. The mask, for example, includes mask blanks on which any pattern is not formed. Furthermore, on an upper surface side of the writing chamber 103, a z sensor having a projector 209 and a light-receiver 210 which detects a position (surface height level of target object, or "height level of target object surface", "surface height of target object", or "height of target object surface", or "target object surface height") in a z direction (direction orthogonal to a writing surface of the target object 101) of the target object 101 is arranged. As the projector 209, for example, a projection element is preferably used. As the light-receiver 210, a position detecting element (PSD: Position Sensitive Device) is preferably used. In the magnetic disk device 114, a writing data is stored in the magnetic disk device 114. The control circuit 110 controls the pattern writing unit 150. The control circuit 110 is connected to, in addition to the pattern writing unit 150, the light-receiver 210, the memory 112, and the magnetic disk device 114 through a bus. In this case, in FIG. 1, components necessary for explaining the first embodiment are described. The writing apparatus 100 includes other necessary configurations as a matter of course.

An electron beam 200 emitted from the electron gun assembly 201 illuminates the entire area of the first aperture plate 203 having an oblong (for example, rectangle) hole by means of the illumination lens 202. In this case, the electron beam 200 is shaped to have an oblong, for example, a rectangle first. The electron beam 200 of the first aperture image passing through the first aperture plate 203 is projected on the second aperture plate 206 by the projection lens 204. A position of the first aperture image on the second aperture plate 206 is deflectively controlled by the shaping deflector 205 to make it possible to change the beam shape and the beam size. As a result, the electron beam 200 is shaped. The electron beam 200 of the second aperture image passing through the second aperture plate 206 is focused by the objective lens 207 and deflected by the deflector 208. As a result, the electron beam 200 is irradiated on a desired position of the target object 101 on the XY stage 105 which continuously moves.

Figure 2:
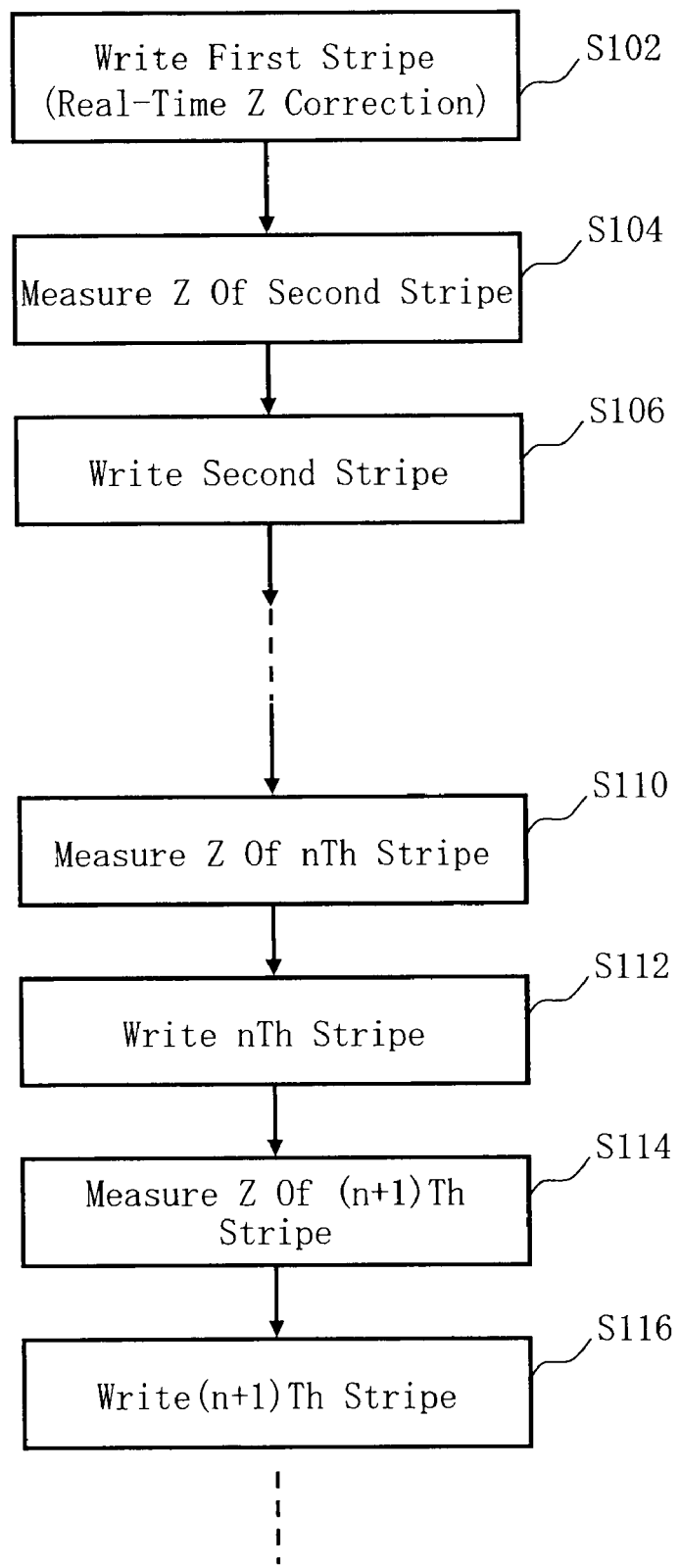
FIG. 2 is a flow chart showing main steps of a writing method according to the first embodiment.

FIG. 2 is a flow chart showing main steps of a writing method according to the first embodiment.

In FIG. 2, the writing method in the first embodiment executes one series of steps such as the first stripe writing step (S102), the second stripe z measuring step (S104), the second stripe writing step (S106), . . . the nth stripe z measuring step (S110), the nth stripe writing step (S112), the (n+1)th stripe z measuring step (S114), the (n+1)th stripe writing step (S116), . . . up to the final stripe.

Figure 3:
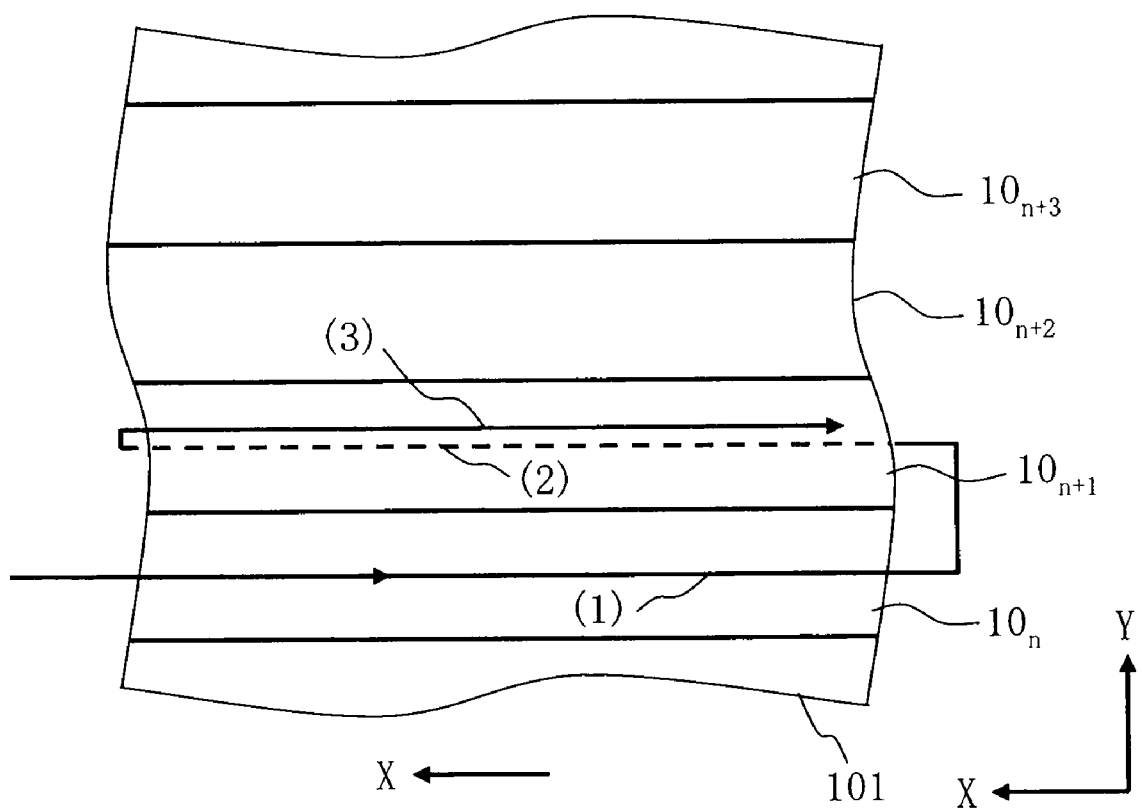
FIG. 3 is a conceptual diagram for explaining one example of a flow of the writing method according to the first embodiment.

FIG. 3 is a conceptual diagram for explaining an example of a flow of a writing method in the first embodiment.

When a pattern is to be written on the target object 101, the electron beam 200 virtually divides a writing (exposure) region surface of the target object 101 into a plurality of stripped stripe regions 10 which can be deflected by the deflector 208. The control circuit 110 reads writing data of one stripe region from the magnetic disk device 114 and converts the writing data into data in a format in the apparatus. The components of the pattern writing unit 150 are consequently controlled on the basis of information of a position, a shape, and a size of a figure defined by the writing data. When an object to be written is defined as described above, the electron beam 200 is irradiated on a target stripe region while continuously moving the XY stage 105 in, for example, an X direction to write a desired figure. As a result, a pattern for this stripe is written.

In S (Step) 102, as the first stripe writing step, the pattern writing unit 150 irradiates the electron beam 200 on a first stripe region while continuously moving the XY stage 105 in, for example, an X direction to write a pattern for a first stripe region. When writing of the first stripe region is started, height measurement is not performed on the XY stage 105 by the z sensor. For this reason, real-time correction is performed. More specifically, the XY stage 105 is continuously moved in the X direction such that a deflection region of the pattern writing unit 150 is on the first stripe region to start writing. A height level (z) of the target object 101 surface is measured at a position any one of a forward position of a writing position of the continuously moving target object 101 and a position almost immediately under the irradiation position. On real time, by using the value of the height level (z), a writing position of a pattern is corrected. At the position, the pattern writing unit 150 writes the pattern which the writing position is corrected based on the height level (z). Alternatively, the height (z) for only the first stripe region is preferably measured in advance. Even in this case, a measurement time can be made considerably shorter than that required when heights of all the writing surfaces are measured.

In S104, as the second stripe z measuring step, upon completion of writing of the first stripe region, the XY stage 105 is moved in a −Y direction by a distance corresponding to one stripe region to a position where the projector 209 can irradiate light on the second stripe region and the light-receiver 210 can receive the light. While the XY stage 105 moves the target object 101 in a direction opposing the X direction, the z sensor measures a target object surface height of the second stripe region. The measured data is temporarily stored in the memory 112.

In S106, as the second stripe writing step, the control circuit 110 corrects a writing position of a pattern for the second stripe region on the basis of the target object surface height of the second stripe region. Upon completion of the measurement of the target object surface height for the second stripe region, the pattern writing unit 150 irradiates the electron beam 200 on the second stripe region while continuously moving the XY stage 105 in the X direction to write the pattern for the second stripe region the writing position of which is corrected. Similarly, pattern writing and height measurement are continuously performed.

In S110, as the nth stripe z measuring step, upon completion of writing of an (n−1)th stripe region, the XY stage 105 is moved in the −Y direction by a distance corresponding to one stripe region to a position where the projector 209 can irradiate light on the second stripe region and the light-receiver 210 can receive the light. While the XY stage 105 moves the target object 101 in a direction opposing the X direction, the z sensor measures a target object surface height z of the nth stripe region. The measured data is temporarily stored in the memory 112.

In S112, as the nth stripe writing step, upon completion of the measurement of the target object surface height of the nth stripe region, the control circuit 110 corrects a writing position of a pattern for a stripe region $10_n$ on the basis of the target object surface height of the measured stripe region $10_n$. The target object surface height of the second stripe region $10_n$ may be read from the memory 112. As indicated by 1 in FIG. 3, the pattern writing unit 150 irradiates the electron beam 200 on the nth stripe region $10_n$ while continuously moving the XY stage 105 in the X direction to write a pattern for the stripe region $10_n$ the writing position of which is corrected.

In S114, as the (n+1)th stripe z measuring step, upon completion of the writing of the stripe region $10_n$, the XY stage 105 is moved in the −Y direction by a distance corresponding to one stripe region to a position where the projector 209 can irradiate light on a stripe region $10_{n+1}$ and the light-receiver 210 can receive the light. As indicated by (2) in FIG. 3, while the XY stage 105 moves the target object 101 in a direction opposing the X direction, the z sensor measures a target object surface height z of the stripe region $10_{n+1}$. The measured data is temporarily stored in the memory 112.

In S116, as the (n+1)th stripe writing step, upon completion of the measurement of the target object surface height of the stripe region $10_{n+1}$, the control circuit 110 corrects a writing position of a pattern for a stripe region $10_{n+1}$ on the basis of the target object surface height of the measured stripe region $10_{n+1}$. The target object surface height of the stripe region $10_{n+1}$, may be read from the memory 112. As indicated by (3) in FIG. 3, the pattern writing unit 150 irradiates the electron beam 200 on the stripe region $10_{n+1}$ while continuously moving the XY stage 105 in the X direction to write a pattern for the second stripe region $10_{n+1}$ the writing position of which is corrected. Thus, the writing position of the pattern for the second stripe region $10_{n+1}$ is corrected, and the pattern for the second stripe region $10_{n+1}$ is written at the corrected writing position on the stripe region $10_{n+1}$. The target object surface height of the stripe region $10_{n+1}$ may be read from the memory 112 as a matter of course. In this manner, in an (n+1)th writing small region, a pattern for the (n+1)th writing small region, wherein the writing position of the pattern is corrected on the basis of the target object surface height of the (n+1)th writing small region measured while moving the target object 101 in the X direction, is written by using the electron beam 200 irradiated through a column used in the writing in the nth writing small region.

As described above, the writing apparatus returns to the writing start position side while measuring the height of the next stripe after writing to make it possible to correct a writing position when the next stripe is written. Execution of multi-writing will be described below.

Figure 4A:
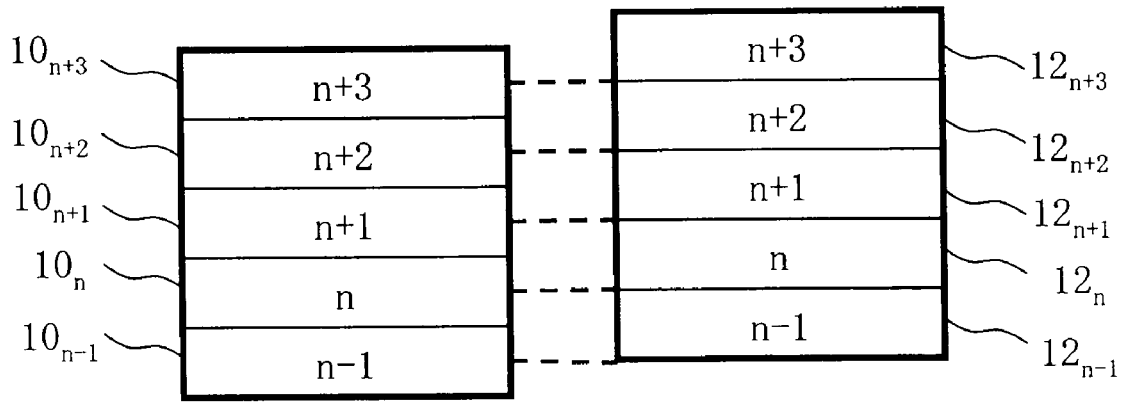
FIGS. 4A and 4B are conceptual diagrams for explaining an example of a flow of the writing method when multi-writing in the first embodiment is performed.
Figure 4B:
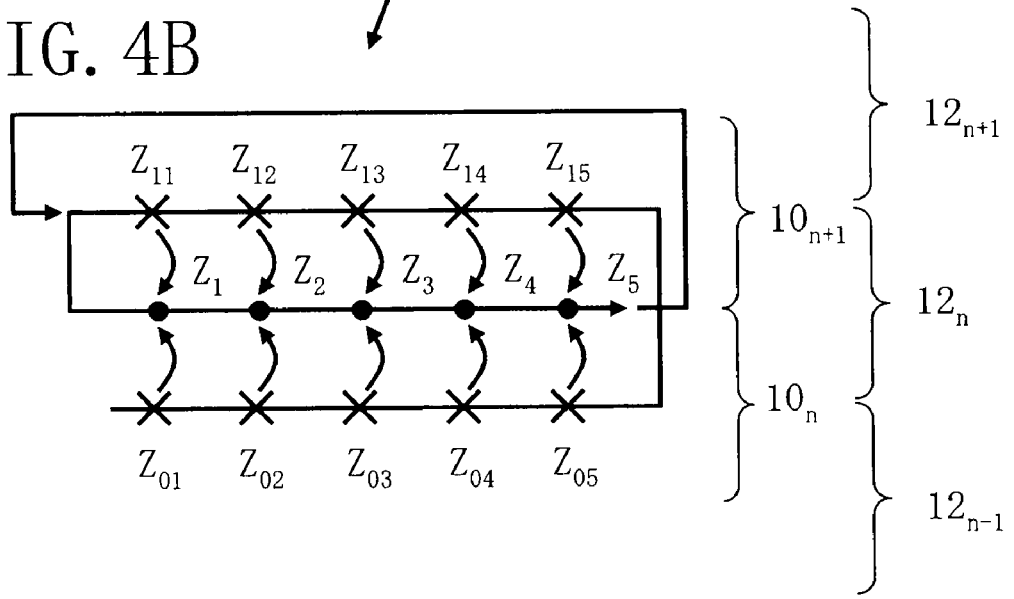
Figure 4B:
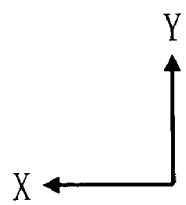

FIGS. 4A and 4B are conceptual diagrams for explaining an example of a flow of a writing method when multi-writing in the first embodiment is performed.

In execution of multi-writing, for example, when writing is performed n times, a stripe region to be written is set at a position shifted from the previous stripe region by 1/n of a stripe width. For example, when writing is performed twice, as shown in FIG. 4A, a stripe region 12 which is written by the second writing is set at a position shifted by a half of the stripe width from the stripe region written by the first writing. After the stripe region $10_{n-1}$ is written, a stripe region $12_{n-1}$ is written. After the second stripe region $10_n$ is written, a stripe region $12_n$ is written. In this manner, writing is sequentially performed.

In the first embodiment, as shown in FIG. 4B, after the second stripe region $10_n$ is written, the XY stage 105 is moved in a −Y direction by a distance corresponding to one stripe region to a position where the projector 209 can irradiate light on the stripe region $10_{n+1}$ and the light-receiver 210 can receive the light. While the XY stage 105 moves the target object 101 in a direction opposing the X direction, the z sensor measures a target object surface height z of the stripe region $10_{n+1}$. The measured data is temporarily stored in the memory 112. The XY stage 105 is moved in the Y direction and returned by a distance corresponding to ½ of the stripe region. The stripe region $12_n$ for the second writing is written. In this case, the stripe region $12_n$ is a region located between the second stripe region $10_n$ and the stripe region $10_{n+1}$. Therefore, when the stripe region $12_n$ is written, the measured target object surface height of the second stripe region $10_n$ and the measured target object surface height of the stripe region $10_{n+1}$ are read from the memory 112. On the basis of the target object surface height of the second stripe region $10_n$ and the target object surface height of the stripe region $10_{n+1}$, a pattern for the stripe region $12_n$ the writing position of which is corrected is written. The target object surface height of the stripe region $12_n$ is preferably calculated by interpolating the target object surface height of the second stripe region $10_n$ and the target object surface height of the stripe region $10_{n+1}$. In the example shown in FIG. 4B, $z_1$ may be calculated from $z_{01}$ and $z_{11}$.

As described above, upon completion of writing of a predetermined region, the writing apparatus returns while measuring z of the next region, the writing apparatus can perform z measuring without setting a new z measuring time. In order to perform the z measurement, a returning speed need not be reduced. As a result, a writing time can be shortened.

Second Embodiment

In the first embodiment, use of the writing apparatus including one column is described. However, the invention is not limited to the configuration. In the second embodiment, use of a writing apparatus having a multicolumn will be described below.

Figure 5:
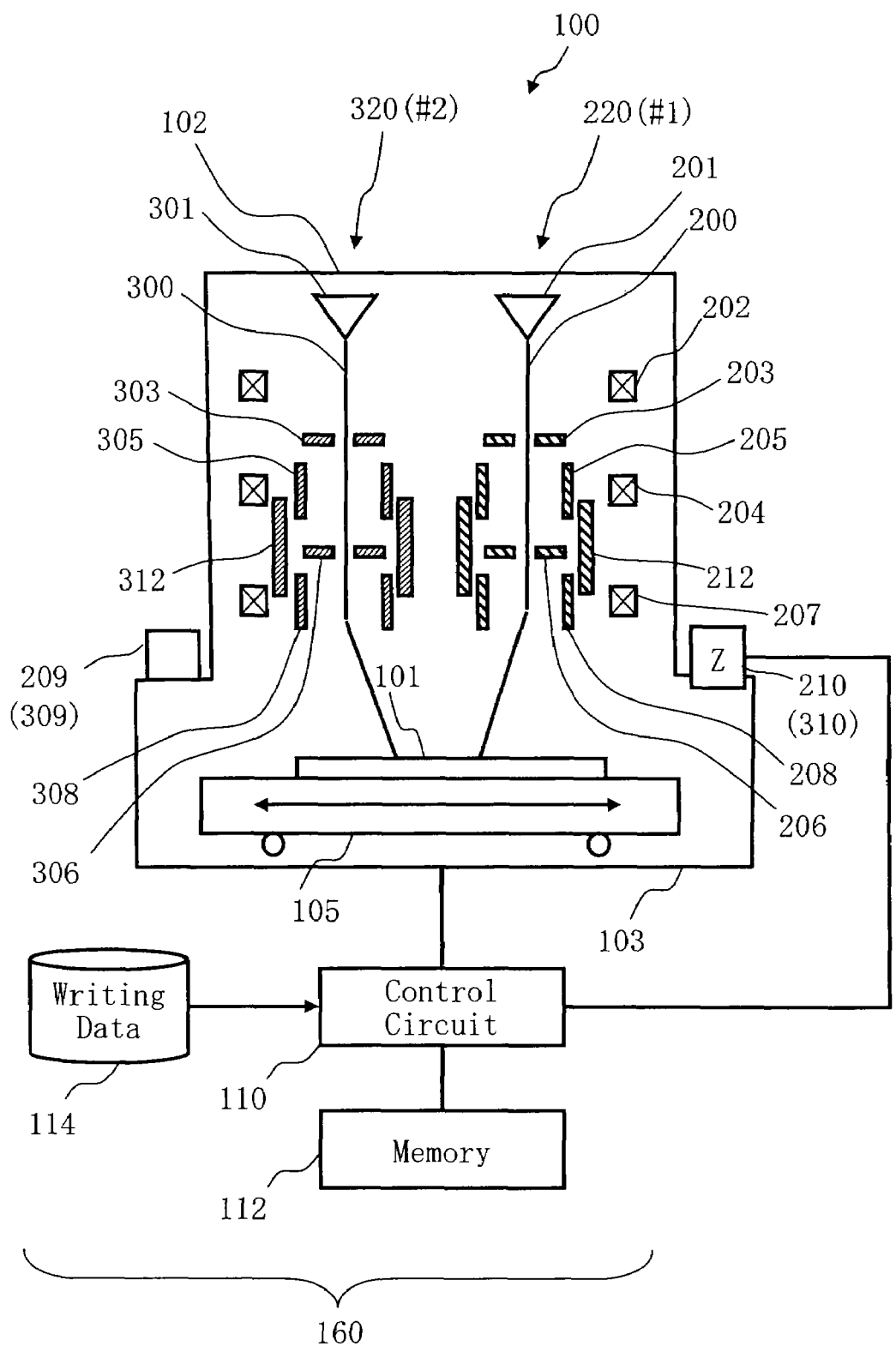
FIG. 5 is a conceptual diagram showing a configuration of a writing apparatus according to a second embodiment.

FIG. 5 is a conceptual diagram showing a configuration of the writing apparatus according to the second embodiment.

In FIG. 5, in the electron lens barrel 102, in addition to the configuration shown in FIG. 1, furthermore, shielding barrels 212, 312, an electron gun assembly 301, a first aperture plate 303, a deflector 305, a second aperture plate 306, and a deflector 308 are arranged. In this case, a first column 220 includes the electron gun assembly 201, the first aperture plate 203, the deflector 205, the second aperture plate 206, the shielding barrel 212, and the deflector 208. A second column 320 includes the electron gun assembly 301, the first aperture plate 303, the shaping deflector 305, the second aperture plate 306, the shielding barrel 312, and the deflector 308. In the electron lens barrel 102, a lens system including the illumination lens 202, the projection lens 204, and the objective lens 207 is shared by the columns to mount a plurality of columns. In this case, a sub-system which controls an optical path of an independent electron beam is called a column. On the upper surface side of the writing chamber 103, in addition to the projector 209 and the light-receiver 210 for the column 220, a z sensor having a projector 309 and a light-receiver 310 for the column 320 is arranged. Like the set of the projector 209 and the light-receiver 210, the set of the projector 309 and the light-receiver 310 detects a position (target object surface height) in a z direction (direction orthogonal to the writing surface of the target object 101) of the target object 101 on which a pattern is written by an electron beam 300 irradiated through the column 320. Other configurations are the same as in FIG. 1. As in the set of the projector 209 and the light-receiver 210, for example, a projecting element is preferably used as the projector 309, and a PSD is preferably used as the light-receiver 310. The control circuit 110 is also connected to the light-receiver 310 through a bus. In this case, in FIG. 5, components necessary for explaining the second embodiment are described. The writing apparatus 100 may include other necessary configurations, as a matter of course.

Figure 6:
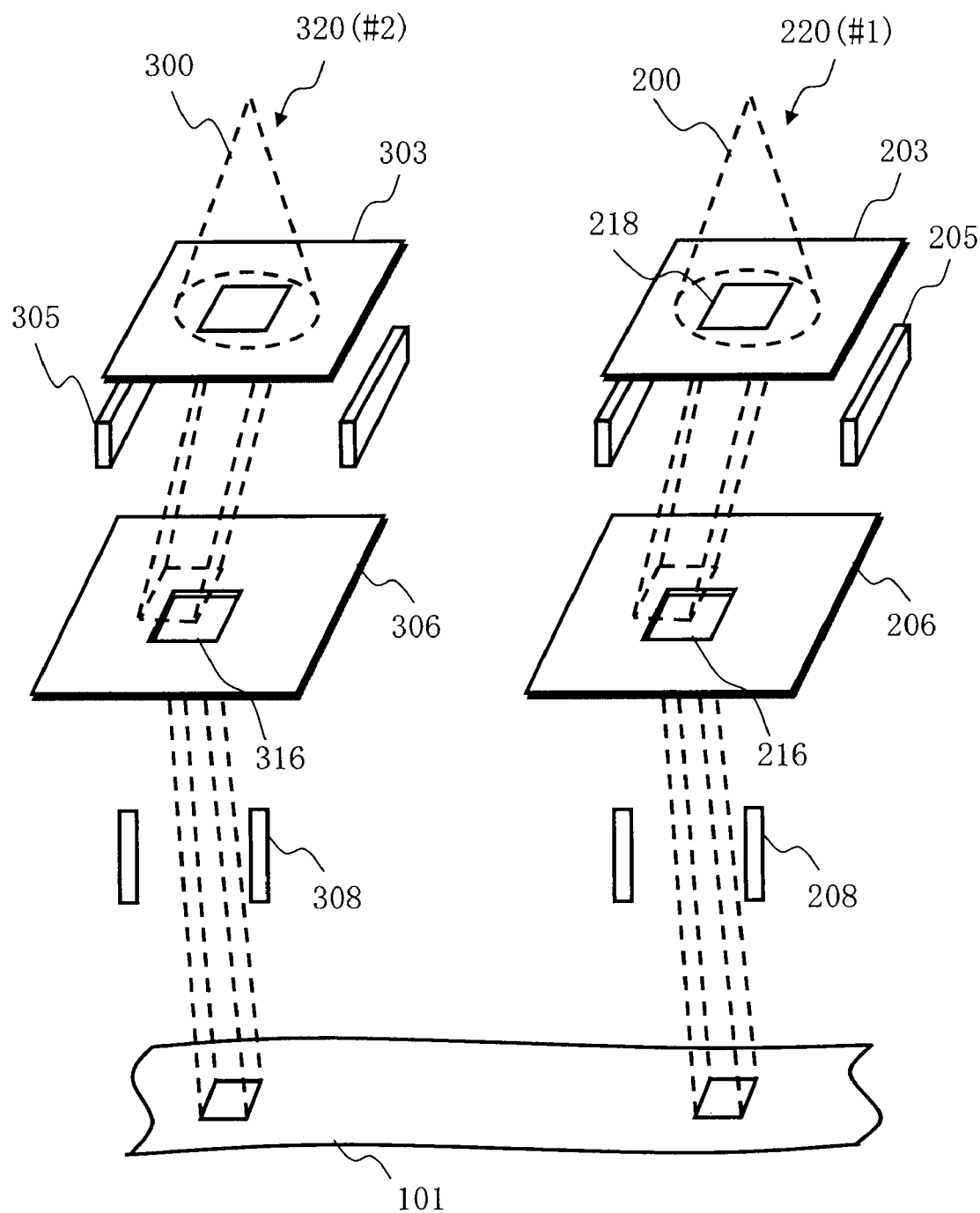
FIG. 6 is a conceptual diagram for explaining an operation of the writing apparatus according to the second embodiment.

FIG. 6 is a conceptual diagram for explaining an operation of the writing apparatus according to the second embodiment.

An operation on the column 220 is the same as that explained in the first embodiment. Like the operation on the column 220 side, the operation on the column 320 is as follows. The electron beam 300 emitted from the electron gun assembly 301 serving as an example of an irradiation unit illuminates the entire area of the first aperture plate 303 having an oblong (for example, rectangle) hole by means of the illumination lens 202. In this case, the electron beam 300 is shaped to have an oblong, for example, a rectangle first. The electron beam 300 of the first aperture image passing through the first aperture plate 303 is projected on the second aperture plate 306 by the projection lens 204. A position of the first aperture image on the second aperture plate 306 is deflectively controlled by the deflector 305 to make it possible to change the beam shape and the beam size. As a result, the electron beam 300 is shaped. The electron beam 300 of the second aperture image passing through the second aperture plate 306 is focused by the objective lens 207 and deflected by the deflector 308. As a result, the electron beam 200 is irradiated on a desired position of the target object 101 on the XY stage 105 which continuously moves.

Figure 7:
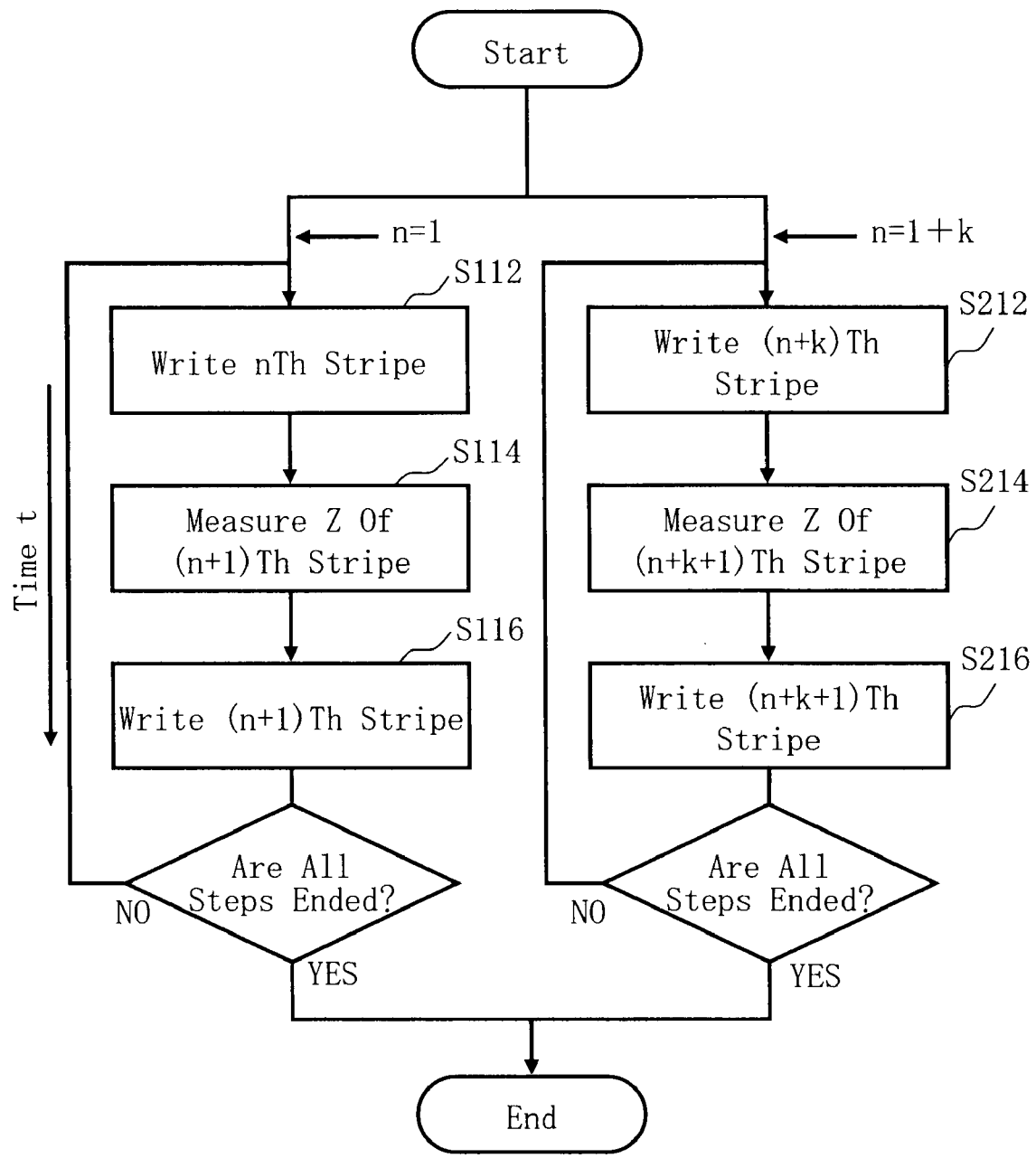
FIG. 7 is a flow chart showing main steps of a writing method according to the second embodiment.

FIG. 7 is a flow chart showing main steps of a writing method according to the second embodiment.

In FIG. 7, the writing method in the second embodiment executes one series of steps such as the (n+k)th stripe writing step (S212), the (n+k)th stripe z measuring step (S214), and the (n+k+1)th stripe writing step (S216) around the same time as one series of steps such as the nth stripe writing step (S112), the (n+1)th stripe z measuring step (S114), and the (n+1)th stripe writing step (S116). The contents of the nth stripe writing step (S112), and the (n+1)th stripe z measuring step (S114), and the (n+1)th stripe writing step (S116) are the same as those in the first embodiment.

Figure 8:
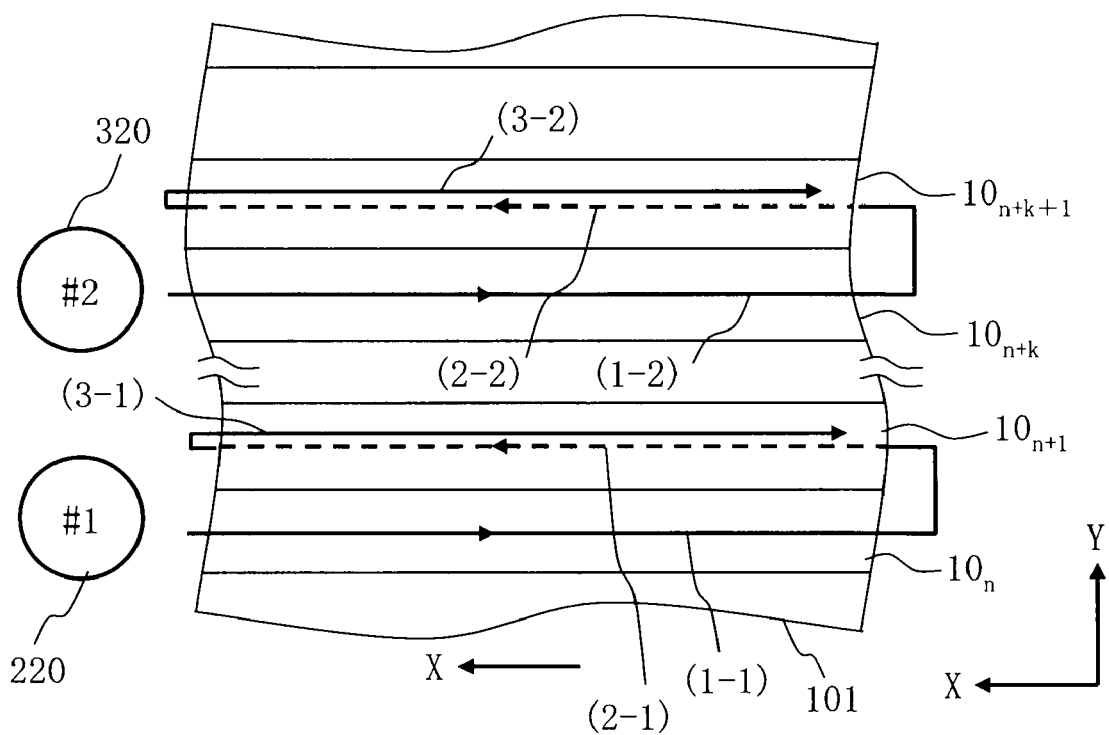
FIG. 8 is a conceptual diagram for explaining an example of a flow of the drawing method according to the second embodiment.

FIG. 8 is a conceptual diagram for explaining an example of a flow of a writing method in the second embodiment.

Since an inter-optical-axis distance between the column 220 and the column 320 is a predetermined distance, two stripe region can be simultaneously written by one moving operation of the XY stage 105. In this case, as indicated by 1-1 and 1-2 in FIG. 8, when the second stripe region $10_n$ is written by the column 220 (S112), around the same time, the stripe region $10_{n+k}$ is written by the column 320 (S212). In this case, k is a natural number which satisfies $k \geq 2$. As in the method of the first embodiment, after the second stripe region $10_n$ is written by the column 220, the XY stage 105 is moved in a $-Y$ direction to a position where the projector 209 can irradiate light on the stripe region $10_{n+1}$ and the light-receiver 210 can receive the light. At this time, also on the column 320, writing of the stripe region $10_{n+k}$ is finished. The XY stage 105 is moved in the $-Y$ direction by a distance corresponding to one stripe region to a position where the projector 309 can irradiate light on the stripe region $10_{n+1+k}$ and the light-receiver 310 can receive the light.

As indicated by (2-2) and (2-2) in FIG. 8, while the XY stage 105 moves the target object 101 in a direction opposing the X direction, a z sensor for the column 220 measures the target object surface height z of the stripe region $10_{n+1}$ (S114). Around the same time, the z sensor for the column 320 measures the target object surface height z of the stripe region $10_{n+k+1}$ (S214). The measured data of the two regions are temporarily stored in the memory 112.

Upon completion of the measurement of the target object surface height of the stripe region $10_{n+1}$ and the measurement of the target object surface height of the stripe region $10_{n+k+1}$, as indicated by (3-1) and (3-2) in FIG. 8, the pattern writing unit 150 irradiates the electron beam 200 passing through the column 220 on the XY stage 105 while continuously moving the XY stage 105 in the X direction, so that a pattern for the stripe region $10_{n+1}$, wherein the writing position of the pattern for the stripe region $10_{n+1}$ is corrected, is written on the basis of the measured target object surface height of the stripe region $10_{n+1}$ (S116). The XY stage 105 is continuously moved in the X direction, and, around the same time, the electron beam 300 passing through the column 320 is irradiated on the stripe region $10_{n+k+1}$ to make it possible to write a pattern for the stripe region $10_{n+k+1}$ (S216). In this case, the pattern for the stripe region $10_{n+k+1}$, wherein the writing position of the pattern for the stripe region $10_{n+k+1}$ is corrected, is written on the basis of the measured target object surface height of the stripe region $10_{n+k+1}$. The target object surface height of the stripe region $10_{n+1}$ and the target object surface height of the stripe region $10_{n+k+1}$ may be read from the memory 112. The correction of the wiring position may be performed by the control circuit 110 on the basis of the measured target object surface height.

With this configuration, different writing small regions can be simultaneously written. For this reason, a writing time can be shortened. Furthermore, when the writing apparatus returns to the next writing start position, the target object surface heights of the next writing small regions can be measured.

As described above, when the stripe regions are to be written, by simultaneously using a plurality of electron beams irradiated through a plurality of columns, the writing time can be further shortened.

Third Embodiment

In the first and second embodiments, the height of the stripe region on the subsequent stage side is measured when the XY stage 105 returns to the writing start position to shorten a writing time. In the third embodiment, execution of real-time correction by the writing apparatus including the multicolumn will be described below. The apparatus configuration uses the writing apparatus including 2×2 four columns as an example.

Figure 9:
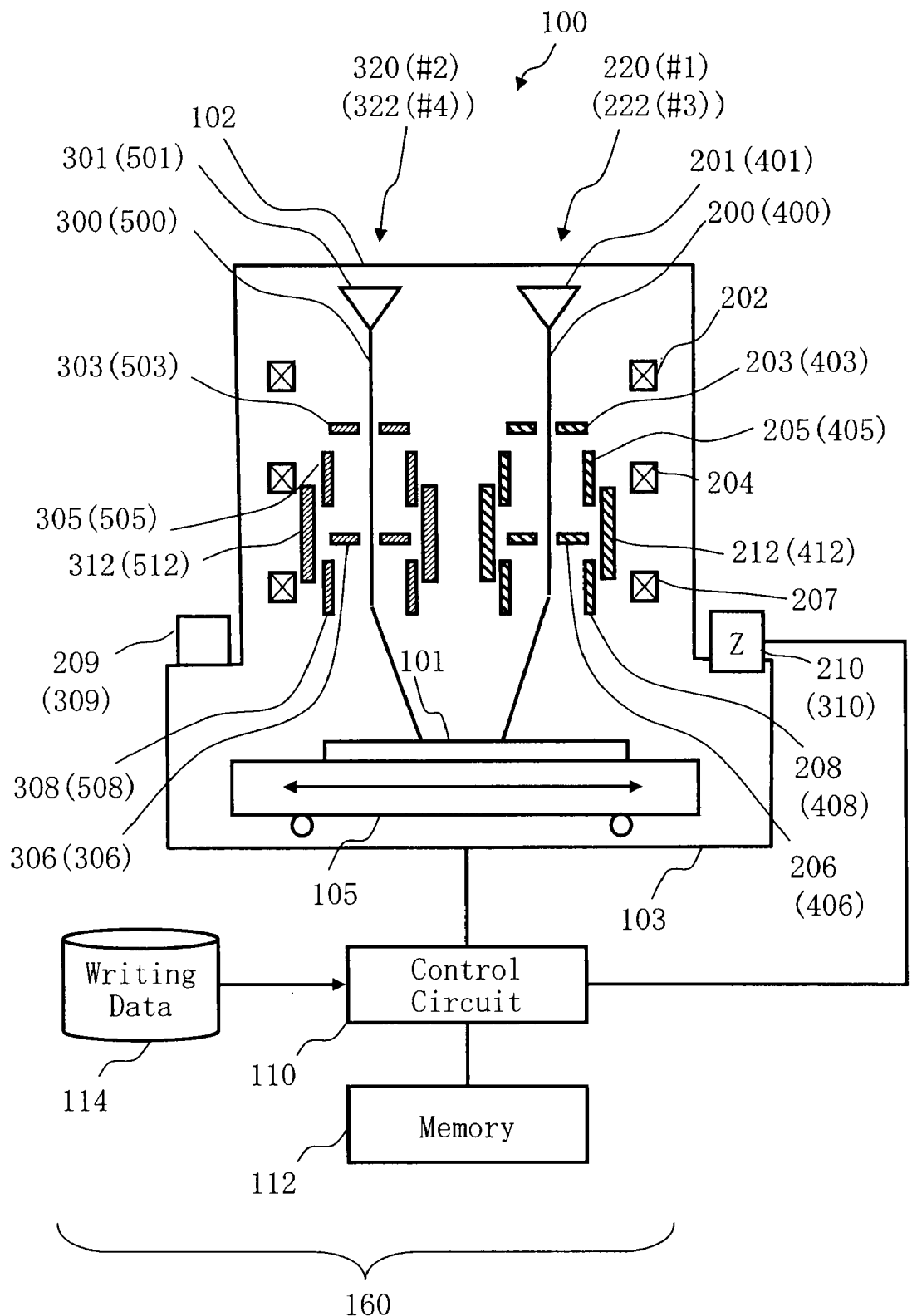
FIG. 9 is a conceptual diagram showing a configuration of a writing apparatus according to a third embodiment.

FIG. 9 is a conceptual diagram showing a configuration of the writing apparatus according to the third embodiment.

In FIG. 9, in the electron lens barrel 102, in addition to the configuration in FIG. 5, furthermore, shielding barrels 412 and 512, electron gun assemblies 401 and 501, first aperture plates 403 and 503, deflectors 405 and 505, second aperture plates 406 and 506, and deflectors 408 and 508 are arranged. In this case, a third column 222 includes the electron gun assembly 401, the first aperture plate 403, the deflector 405, the second aperture plate 406, the shielding barrel 412, and the deflector 408. A fourth column 322 includes the electron gun assembly 501, the first aperture plate 503, the deflector 505, the second aperture plate 506, the shielding barrel 512, and the deflector 508. In the electron lens barrel 102, a lens system including the illumination lens 202, the projection lens 204, and the objective lens 207 is shared by the columns to mount a plurality of columns 220, 320, 222, and 322. In this case, a sub-system which controls an optical path of an independent electron beam is called a column. The other points are the same as those in FIG. 5. The apparatus configuration is the same as the configuration in which the two columns shown in FIG. 5 are added. For example, one stripe regions are simultaneously written at front and rear positions in the first and second columns. the other stripe regions are simultaneously written at front and rear positions in the third and fourth columns. In this case, in FIG. 9, components necessary for explaining the third embodiment are described. The writing apparatus 100 may include other necessary configurations, as a matter of course.

Operations in the column 222 and the column 322 are the same as those of the column 220 and the column 320, respectively. An operation on the column 222 is performed as follows. An electron beam 400 emitted from the electron gun assembly 401 serving as an example of an irradiation unit illuminates the entire area of the first aperture plate 403 having an oblong (for example, rectangle) hole by means of the illumination lens 202. In this case, the electron beam 400 is shaped to have an oblong, for example, a rectangle first. The electron beam 400 of the first aperture image passing through the first aperture plate 403 is projected on the second aperture plate 406 by the projection lens 204. A position of the first aperture image on the second aperture plate 406 is deflectively controlled by the deflector 405 to make it possible to change the beam shape and the beam size. As a result, the electron beam 400 is shaped. The electron beam 400 of the second aperture image passing through the second aperture plate 406 is focused by the objective lens 207 and deflected by the deflector 408. As a result, the electron beam 400 is irradiated on a desired position of the target object 101 on the XY stage 105 which continuously moves.

Similarly, an operation on the column 322 side is performed as follows. An electron beam 500 emitted from the electron gun assembly 501 serving as an example of an irradiation unit illuminates the entire area of the first aperture plate 503 having an oblong (for example, rectangle) hole by means of the illumination lens 202. In this case, the electron beam 400 is shaped to have an oblong, for example, a rectangle first. The electron beam 500 of the first aperture image passing through the first aperture plate 503 is projected on the second aperture plate 506 by the projection lens 504. A position of the first aperture image on the second aperture plate 506 is deflectively controlled by the deflector 505 to make it possible to change the beam shape and the beam size. As a result, the electron beam 500 is shaped. The electron beam 500 of the second aperture image passing through the second aperture plate 506 is focused by the objective lens 207 and deflected by the deflector 508. As a result, the electron beam 500 is irradiated on a desired position of the target object 101 on the XY stage 105 which continuously moves.

Figure 10:
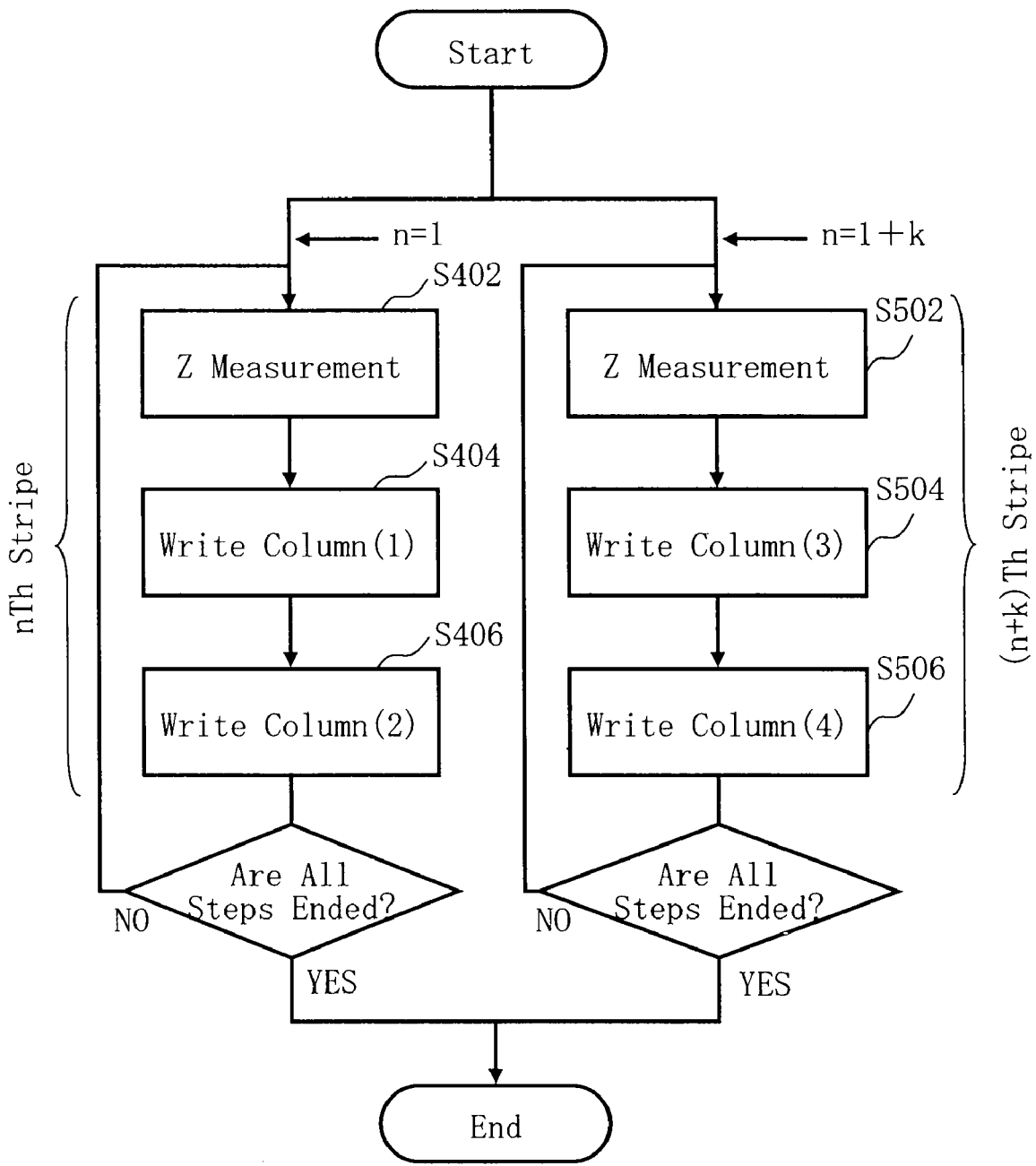
FIG. 10 is a flow chart showing main steps of a writing method according to the third embodiment.

FIG. 10 is a flow chart showing main steps of a writing method according to the third embodiment.

In FIG. 10, the writing method according to the third embodiment executes one series of steps such as the nth stripe z measuring step (S402), the nth stripe column (1) writing step (S404), and the nth stripe column (2) writing step (S406). Furthermore, around the same time, the (n+k)th stripe z measuring step (S502), the (n+k)th stripe column (3) writing step (S504), and the (n+k)th stripe column (4) writing step (S506) are executed.

Figure 11:
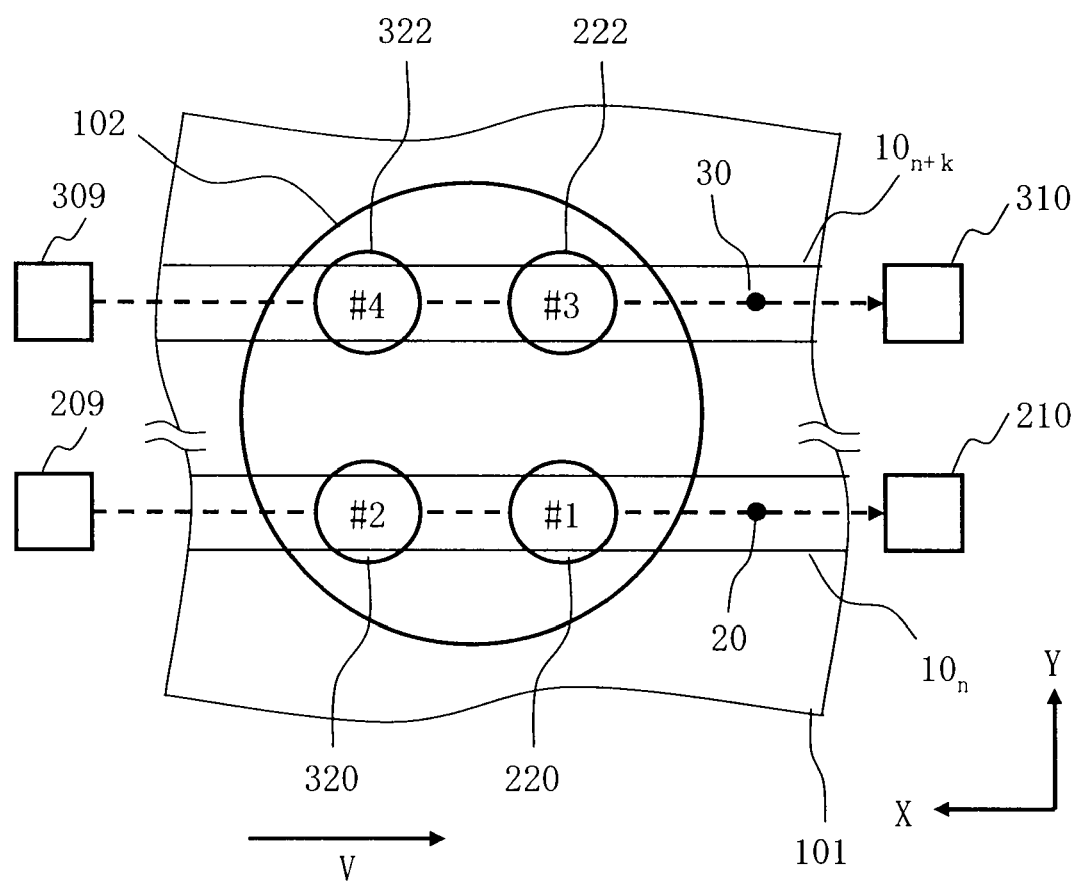
FIG. 11 is a conceptual diagram for explaining an example of a flow of the writing method according to the third embodiment.

FIG. 11 is a conceptual diagram for explaining an example of a flow of the writing method according to the third embodiment.

In the electron lens barrel, as shown in FIG. 11, the four columns 220, 320, 222, and 322 are arranged in two rows and two columns. Since inter-optical-axis distances between the columns are predetermined distances, two stripe regions can be written around the same time by one moving operation of the XY stage 105. Furthermore, the same stripe regions can be written in two columns by one moving operation of the XY stage 105. In the example in FIG. 11, stripe regions $10_n$ are written in the two columns 220 and 320. The stripe regions $10_{n+k}$ are written in the two columns 222 and 322. Note that k is a natural number which satisfies k≧1. Since a writing operation is performed in a direction opposing the X direction by moving the XY stage 105 in the X direction, a −X direction is a writing direction V. In this case, with respect to the writing direction V, the column 220 writes the front side of the second stripe region $10_n$. The column 320 is located at the back of the column 220, and the column 320 writes the rear side of the stripe region $10_{n+k}$. The column 322 is located at the back of the column 222 with respect to the writing direction V, and the column 322 writes the rear side of the stripe region $10_{n+k}$.

The two columns 220 and 320 use one z sensor. In this case, as the z sensor for the two columns 220 and 320, a set of the projector 209 and the light-receiver 210 is used. The z sensor for the columns 220 and 320 is located at a position where a height of the target object 101 at a position 20 in front of a position on which the column 220 irradiates the electron beam 200 in the writing direction V can be measured. Alternatively, the position may be a position almost immediately under the position on which the column 220 irradiates the electron beam 200. In this case, the position almost immediately under the irradiation position also includes a slightly rear position. Similarly, one z sensor is used by the two columns 222 and 322. In this case, as the z sensor for the two columns 222 and 322, a set of the projector 309 and the light-receiver 310 is used. The z sensor for the columns 222 and 322 is located at a position where a height of the target object 101 at a position 30 in front of a position on which the column 222 irradiates the electron beam 400 in the writing direction V can be measured. Alternatively, the position may be a position almost immediately under the position on which the column 222 irradiates the electron beam 400. In this case, the position almost immediately under the irradiation position also includes a slightly rear position.

As described above, two columns include one z sensor. More specifically, the z sensors the number of which is smaller than the number of columns are included.

In S402, as the nth stripe z measuring step, the XY stage 105 moves the target object 101 in the X direction. The z sensor for the columns 220 and 320 measures the target object surface height z of the stripe region $10_n$ of the target object 101 which moves in the X direction. The target object surface height z of the stripe region $10_n$ is temporarily stored in the memory 112.

In S404, as the nth stripe column (1) writing step, the control circuit 110 corrects a writing position of a pattern for the stripe region $10_n$ on the basis of the measured target object surface height of the stripe region $10_n$. By using the electron beam 200 irradiated through the column 220, a pattern for a column (1) of the stripe region $10_n$, wherein the writing position of the pattern for a column (1) of the stripe region $10_n$ is corrected on real time, is written in the stripe region $10_n$ on the target object 101 which moves in the X direction.

In S406, as the nth stripe column (2) writing step, by using the electron beam 300 irradiated through the column 320 located at the back, a pattern for a column (2) of the stripe region $10_n$, wherein the writing position of the pattern for a column (2) of the stripe region $10_n$ is corrected by using information of the target object surface height of the stripe regions $10_n$ used once, is written in the stripe region $10_n$ on the target object 101 which moves in the X direction again. In order to use the information of the measured height in correction in the backward column 320, the information of the measured height may be stored in the pattern memory 122 together with position information on the stripe region $10_n$.

Figure 12:
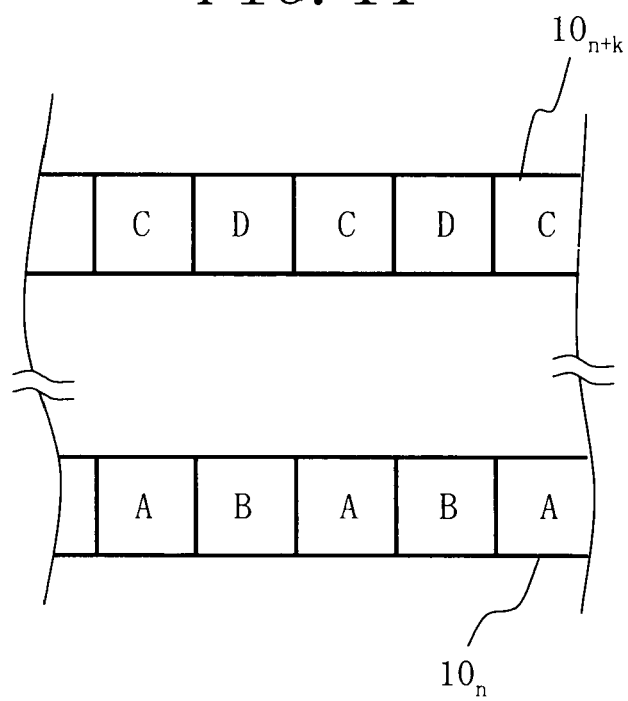
FIG. 12 is a diagram showing an example of a region which is written in each column in the third embodiment.

FIG. 12 is a diagram showing an example of a region which is written in each column in the third embodiment.

In this case, a region indicated by "A" is written in the column 220, and a region indicated by "B" is written in the column 320. In this manner, the writing regions are alternately divided to be written around the same time, so that a writing time can be shortened. Alternatively, a pattern in each region may be written every half pattern.

As described above, height measurement and writing position correction are performed during one writing operation. For this reason, a time for measuring a height need not be additionally prepared. Therefore, a writing time can be shortened. Furthermore, even though forward and backward columns 220 and 320 in two steps are used with respect to one stripe region $10_n$, the writing position can be corrected by only one z sensor. More specifically, the writing position can be corrected by the z sensors the number of which is smaller than the number of columns.

In S502, as the (n+k)th stripe z measuring step, around the same time as the measurement of the target object surface height of the stripe region $10_n$, the z sensor for the columns 222 and 322 measures the target object surface height of the stripe region $10_{n+k}$ on the target object 101 which moves in the X direction. The target object surface height z of the stripe region $10_{n+k}$ may be temporarily stored in the memory 112.

In S504, as the (n+k)th stripe column (3) writing step, around the same time as writing in the stripe region $10_n$ by using the column 220, the control circuit 110 corrects a writing position of a pattern for the stripe region $10_{n+k}$ on the basis of the measured target object surface height of the stripe region $10_{n+k}$. By using the electron beam 400 irradiated through the column 222 located at a forward position in the X direction, a pattern for a column (3) of the stripe region $10_{n+k}$, wherein the writing position of the pattern for a column (3) of the stripe region $10_{n+k}$ is corrected on real time, is written in the stripe region $10_{n+k}$ on the target object 101 which moves in the X direction.

In S506, as the (n+k)th stripe column (4) writing step, around the same time as writing in the stripe region $10_n$ by using the column 220, by using the electron beam 500 irradiated through the column 322 located at a backward position in the X direction, a pattern for a column (4) of the stripe region $10_{n+k}$, wherein the writing position of the pattern for a column (4) of the stripe region $10_{n+k}$ is corrected by using information of the target object surface height of the stripe regions $10_{n+k}$ used once, is written in the stripe region $10_{n+k}$ on the target object 101 which moves in the X direction again. In order to use the information of the measured height in correction in the backward column 322, the information of the measured height may be stored in the pattern memory 122 together with position information on the stripe region $10_{n+k}$.

In this case, as shown in FIG. 12, a region indicated by "C" is written in the column 222, and a region indicated by "D" is written in the column 322. In this manner, the writing regions are alternately divided to be written around the same time, so that a writing time can be shortened. As described above, a pattern in each region maybe written every half pattern.

With the above configuration, although the number of sensors z is reduced, writing at corrected writing positions on two columns can be performed at the same time. As a result, a writing time can be more shortened.

As described above, the writing time can be shortened. Furthermore, even though a multicolumn is used in correction of a writing position by measuring a height on real time, the number of sensors which measure the heights can be made smaller than the number of columns.

In the above description, in the writing apparatus 100 including a multicolumn described in the first and second embodiment, each electron lens is shared. However, the present invention is not limited to this configuration.

Figure 13:
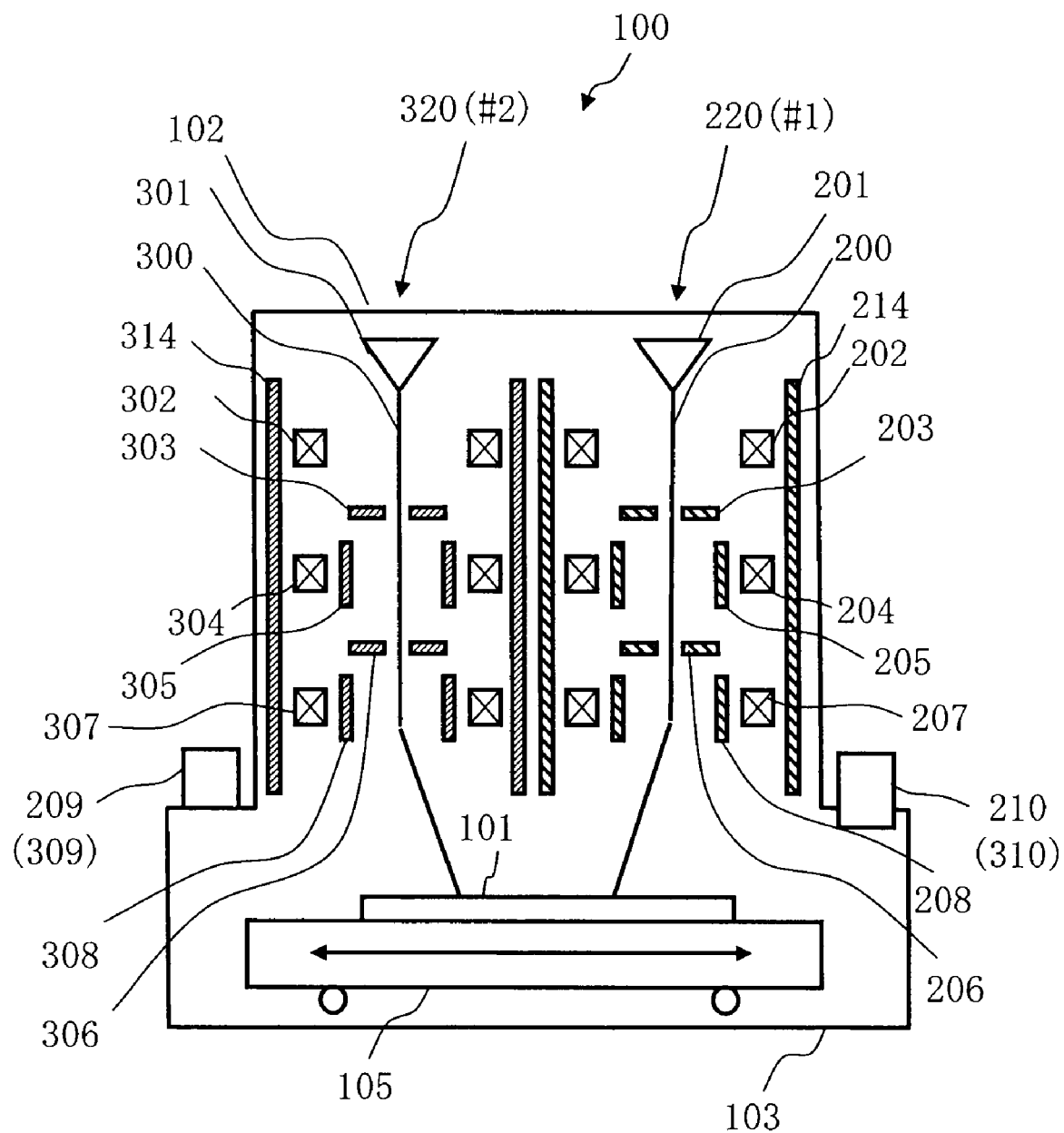
FIG. 13 is a conceptual diagram showing a configuration of a writing apparatus including a multicolumn having an independent lens system.
Figure 14:
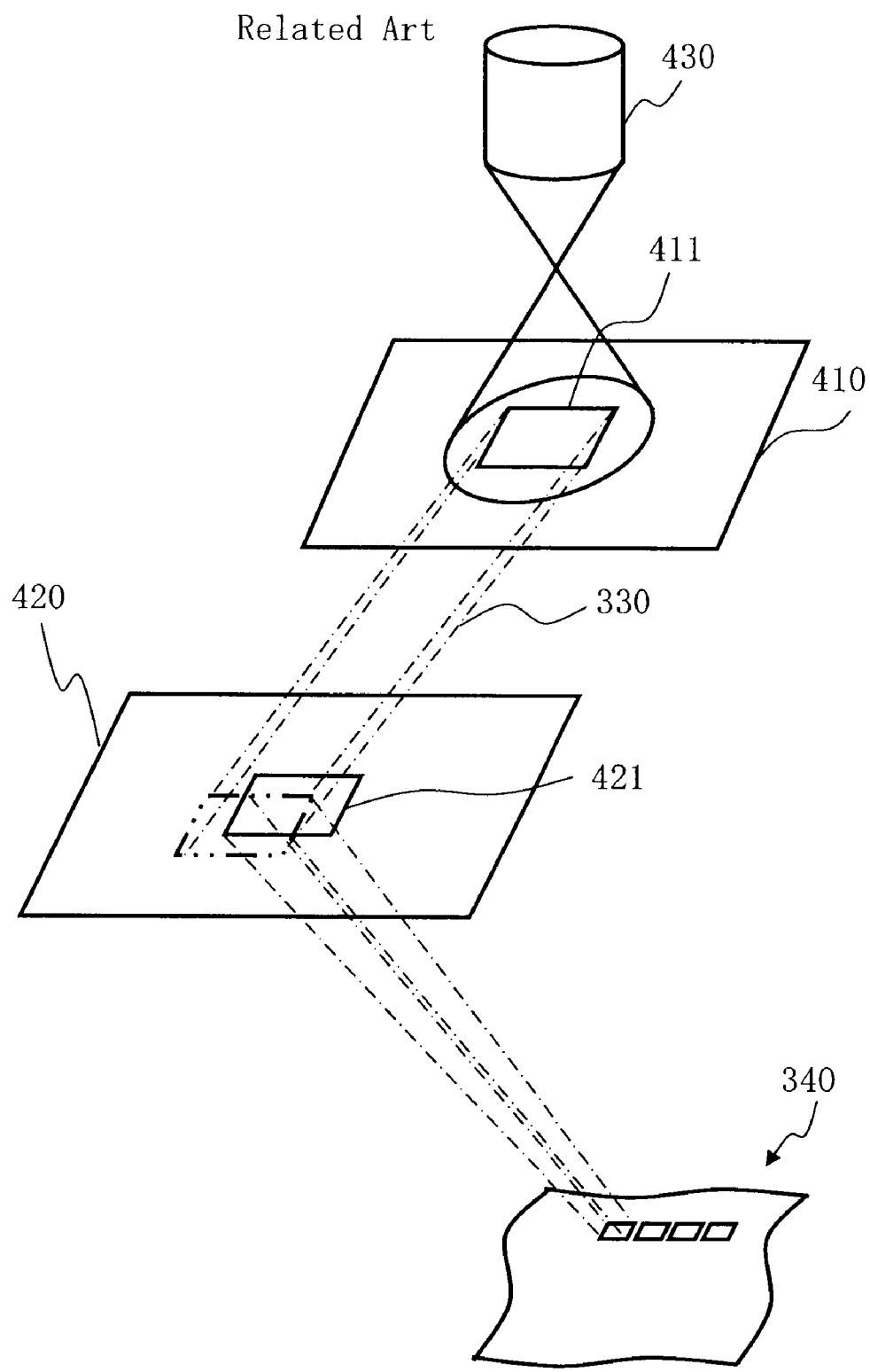
FIG. 14 is a conceptual diagram for explaining an operation of a conventional variable-shaped electron beam photolithography apparatus.

FIG. 13 is a conceptual diagram showing a configuration of a writing apparatus including a multicolumn having an independent lens system.

In this case, as an example, the two multicolumns 220 and 320 corresponding to FIG. 5 are described. A control system, although not shown, is the same as that in FIG. 5. The first column 220 includes the electron gun assembly 201, the illumination lens 202, the first aperture plate 203, the projection lens 204, the deflector 205, the second aperture plate 206, the objective lens 207, the deflector, and an insulating column 214. The second column 320 includes the electron gun assembly 301, an illumination lens 302, the first aperture plate 303, a projection lens 304, the deflector 305, the second aperture plate 306, an objective lens 307, the deflector 308, and the insulating column 314. In the second and third embodiments, a lens system including the illumination lens 202, the projection lens 204, and the objective lens 207 is shared by columns. However, as shown in FIG. 13, in the electron lens barrel 102, lens systems are independent of each other in units of columns, and a plurality of columns may be preferably mounted. In the insulating column 214, the electron gun assembly 201, the illumination lens 202, the first aperture plate 203, the projection lens 204, the deflector 205, the second aperture plate 206, the objective lens 207, the deflector 208 are stored. Similarly, in the insulating column 314, the electron gun assembly 301, the illumination lens 302, the first aperture plate 303, the projection lens 304, the shaping deflector 305, the second aperture plate 306, the objective lens 307, and the deflector 308 are stored. In this manner, sub-systems which control optical paths of independent electron beams are stored in the insulating columns, respectively, to insulate the sub-systems from each other, so that an influence of an electric field or a magnetic field on the opposite party can be excluded. As in the case in which 2×2 four columns are mounted, the lens systems are preferably independent in units of columns to mount a plurality of columns, as a matter of course.

The embodiments are described with reference to the concrete examples. However, the present invention is not limited to the concrete examples. For example, in the first and second embodiments, the writing apparatus performs z measurement while returning on the next writing region. However, as a method of shortening the writing time, the following method may be used. For example, drift correction may be performed before writing or during the writing. In the drift correction, marks are additionally formed on the XY stage 105 are scanned by an electron beam to measure quantity of drift, and correction is performed by the quantity of drift. In this manner, in execution of the drift correction, the XY stage 105 is moved until mark positions are matched with irradiatable positions of the columns. In movement to the mark positions, z measurements in certain stripe regions are simultaneously performed. Accordingly, the z measuring time may be shortened. In this manner, a writing time can be shortened by the shortening of the z measuring time.

Parts such as an apparatus configuration and a control method which are not directly necessary for the explanation of the present invention are omitted. However, a necessary apparatus configuration and a necessary control method can be arbitrarily selected and used. For example, a description of a control unit configuration for controlling the writing apparatus 100 is omitted. However, a necessary control unit configuration can be arbitrarily selected and used, as a matter of course.

Furthermore, all charged particle beam writing methods and apparatuses which include the elements of the present invention and which can be arbitrary changed in design by a person skilled in the art are included in the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a stage on which a target object is placed and which moves in a predetermined direction;
a first column configured to irradiate a first charged particle beam on a writing region of the target object;
a second column which is located at the back of the first column in the predetermined direction and configured to irradiate a second charged particle beam on the writing region of the target object; and
a sensor configured to measure a height level of the target object at any one of a position in front of a position where the first column irradiates the first charged particle beam in the predetermined direction and a position almost immediately under the position where the first charged particle beam is irradiated.

2. The apparatus according to claim 1, wherein
the number of sensors which include the sensor and which measure the height level of the target object is smaller than the number of columns.

3. The apparatus according to claim 1, further comprising:
a third column configured to irradiate a third charged particle beam on a writing region different from the writing region on which the first column irradiates the first charged particle beam.

4. The apparatus according to claim 3, further comprising:
a fourth column which is located at the back of the third column in the predetermined direction and configured to irradiate a fourth charged particle beam on the writing region on which the third columns irradiates the third charged particle beam.

5. The apparatus according to claim 4, further comprising:
a second sensor configured to measure a height level of the target object at any one of a position in front of a position where the third column irradiates the third charged particle beam in the predetermined direction and a position almost immediately under the position where the third charged particle beam is irradiated.

6. A charged particle beam writing method comprising:
measuring a surface height level of an nth writing small region of a plurality of writing small regions formed by virtually dividing a writing region of a target object in the form of stripes while moving the target object in a predetermined direction;
by using a charged particle beam irradiated through a first column located at a forward position in the predetermined direction, writing a first pattern, wherein a writing position of the first pattern is corrected on the basis of the surface height level of the nth writing small region in the nth writing small region on the target object which moves in the predetermined direction; and by using a charged particle beam irradiated through a second column located at a backward position in the predetermined direction, writing a second pattern, wherein a writing position of the second pattern is corrected by using information, used once, of the surface height level of the nth writing small region again in the nth writing small region on the target object which moves in the predetermined direction.

7. The method according to claim 6, further comprising:

measuring a surface height level of an (n+k)th ($k \geq 1$) writing small region on the target object which moves in the predetermined direction around the same time as the measurement of the surface height level of the nth writing small region;

around a same time as the writing using the first column in the nth writing small region, by using a charged particle beam irradiated through a third column located at a forward position in the predetermined direction, writing a third pattern, wherein a writing position of the third pattern is corrected on the basis of a measured surface height level of the (n+k)th writing small region in the (n+k)th writing small region on the target object which moves in the predetermined direction; and around a same time as the writing using the second column in the nth writing small region, by using a charged particle beam irradiated through a fourth column located at a backward position in the predetermined direction, writing a fourth pattern, wherein a writing position of the fourth pattern is corrected by using information, used once, of the surface height level of the (n+k)th writing small region in the (n+k)th writing small region on the target object which moves in the predetermined direction.

8. A charged particle beam writing method comprising:

writing a pattern for the nth writing small region of a plurality of writing small regions formed by virtually dividing a writing region of a target object in the form of stripes while moving the target object in a predetermined direction;

upon completion of the writing of the nth writing small region, measuring a surface height level of an (n+1)th writing small region while moving the target object in a direction opposing the predetermined direction; and upon completion of the measurement of the surface height level of the (n+1)th writing small region, in the (n+1)th writing small region, by using a charged particle beam irradiated through a column used in the writing in the nth writing small region, writing a pattern for the (n+1)th writing small region, wherein a writing position of the pattern for the (n+1)th writing small region is corrected on the basis of a measured surface height level of the (n+1)th writing small region, while moving the target object in the predetermined direction.

9. The method according to claim 8, wherein when each of the writing small regions is writing, a plurality of charged particle beams irradiated through a plurality of columns are used.

10. The method according to claim 8, further comprising:

around a same time as the writing in the nth writing small region, in the (n+k)th ($k \geq 2$) writing small region on the target object which moves in the predetermined direction, writing a pattern for the (n+k)th writing small region by using a charged particle beam irradiated from a another column different from the column used in the writing in the nth writing small region;

around a same time as the measurement of the surface height level of the (n+1)th writing small region, measuring a surface height level of an (n+k+1)th writing small region on the target object which moves in a direction opposing the predetermined direction; and around a same time as the writing in the (n+1)th writing small region, in the (n+k+1)th writing small region on the target object which moves in the predetermined direction, by using a charged particle beam irradiated through the another column used in the writing in the (n+k)th writing small region, writing a pattern for the (n+k+1)th writing small region, wherein a writing position of the pattern for the (n+k+1)th writing small region is corrected on the basis of a measured surface height level of the (n+k+1)th writing small region.

* * * * *